United States Patent
Ohashi

(10) Patent No.: US 10,784,090 B2
(45) Date of Patent: Sep. 22, 2020

(54) PLASMA PROCESSING DEVICE AND SEMICONDUCTOR DEVICE PRODUCTION METHOD

(71) Applicant: TOSHIBA MEMORY CORPORATION, Minato-ku, Tokyo (JP)

(72) Inventor: Takashi Ohashi, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/290,808

(22) Filed: Mar. 1, 2019

(65) Prior Publication Data

US 2020/0075296 A1    Mar. 5, 2020

(30) Foreign Application Priority Data

Sep. 4, 2018   (JP) .................. 2018-165343

(51) Int. Cl.
*H01L 21/00* (2006.01)
*H01J 37/32* (2006.01)
*H01L 21/3065* (2006.01)

(52) U.S. Cl.
CPC .. *H01J 37/32669* (2013.01); *H01J 37/32568* (2013.01); *H01L 21/3065* (2013.01); *H01J 2237/3341* (2013.01)

(58) Field of Classification Search
CPC ............. H01L 21/3065; H01L 21/2236; H01L 21/67069; H01L 21/2855; H01J 37/32669; H01J 37/32568; H01J 37/321; H01J 37/3266; H01J 37/32412; H01J 37/32798; H01J 2237/3341; H01J 2237/0206; H01J 2237/3402

See application file for complete search history.

(56) References Cited

U.S. PATENT DOCUMENTS

| | | | |
|---|---|---|---|
| 6,341,574 B1 | 1/2002 | Bailey, III et al. | |
| 6,403,491 B1 * | 6/2002 | Liu ................... | H01J 37/32522 257/E21.252 |
| 7,700,465 B2 * | 4/2010 | Collins ............. | H01J 37/32082 257/E21.001 |

FOREIGN PATENT DOCUMENTS

| | | |
|---|---|---|
| JP | 4408987 B2 | 2/2010 |
| JP | 4704645 B2 | 6/2011 |
| JP | 5890609 B2 | 3/2016 |

* cited by examiner

*Primary Examiner* — Nikolay K Yushin
(74) *Attorney, Agent, or Firm* — Foley & Lardner LLP

(57) ABSTRACT

A plasma processing device includes a chamber; a substrate stage that supports a substrate inside the chamber; a plasma generator that generates plasma by which the substrate is processed in a space above the substrate inside the chamber; and an electromagnet. The electromagnet is provided in each of a plurality of regions, which are provided on a top of the chamber in an upper part thereof, so as to be independently movable. The plasma processing device further includes a controller configured to move the electromagnet to produce a uniform plasma density onto the substrate.

16 Claims, 5 Drawing Sheets

PLASMA PROCESSING DEVICE AND SEMICONDUCTOR DEVICE PRODUCTION METHOD

CROSS-REFERENCE TO RELATED APPLICATION(S)

This application is based upon and claims the benefit of priority from Japanese Patent Application No. 2018-165343, filed on Sep. 4, 2018, the entire contents of which are incorporated herein by reference.

FIELD

Embodiments described herein relate generally to plasma processing devices and semiconductor device production methods.

BACKGROUND

Some plasma processing devices have a high-frequency antenna and two concentric electromagnets on top of a chamber. The electromagnets may affect plasma density during processing. The locations of such concentric electromagnets can be changed (i.e., the concentric electromagnets are moveable).

DETAILED DESCRIPTION

In some plasma processing devices, it is difficult to maintain the symmetry of the plasma density when the circular electromagnets move. Embodiments herein provide a plasma processing device and a semiconductor device production method, in which the device and the method can easily maintain the symmetry of plasma density.

In general, according to at least one embodiment, a plasma processing device includes: a chamber; a substrate stage that supports a substrate inside the chamber; a plasma generating section that generates plasma, by which the substrate is processed, in a space above the substrate inside the chamber; and an electromagnet section. The electromagnet section is provided in each of a plurality of regions, which are provided on a top of the chamber in an upper part thereof, so as to be independently movable.

Hereinafter, a plasma processing device and a semiconductor device production method according to at least one embodiment will be described in detail with reference to the accompanying drawings. The discussion of one or more embodiments is not intended to be limiting.

Figure 1:
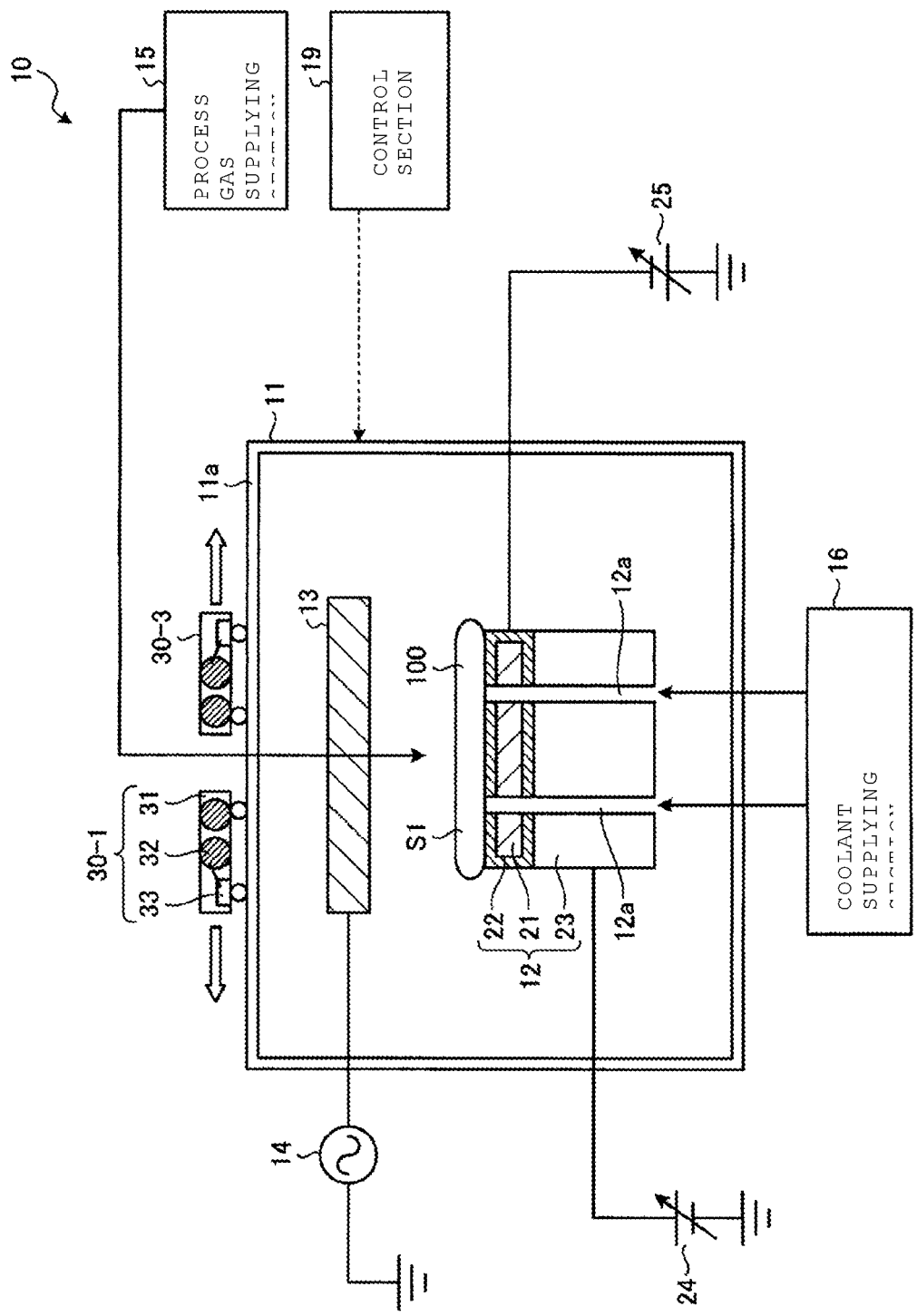
FIG. 1 is a sectional view schematically depicting an example of the configuration of a plasma processing device according to at least one embodiment.
Figure 2:
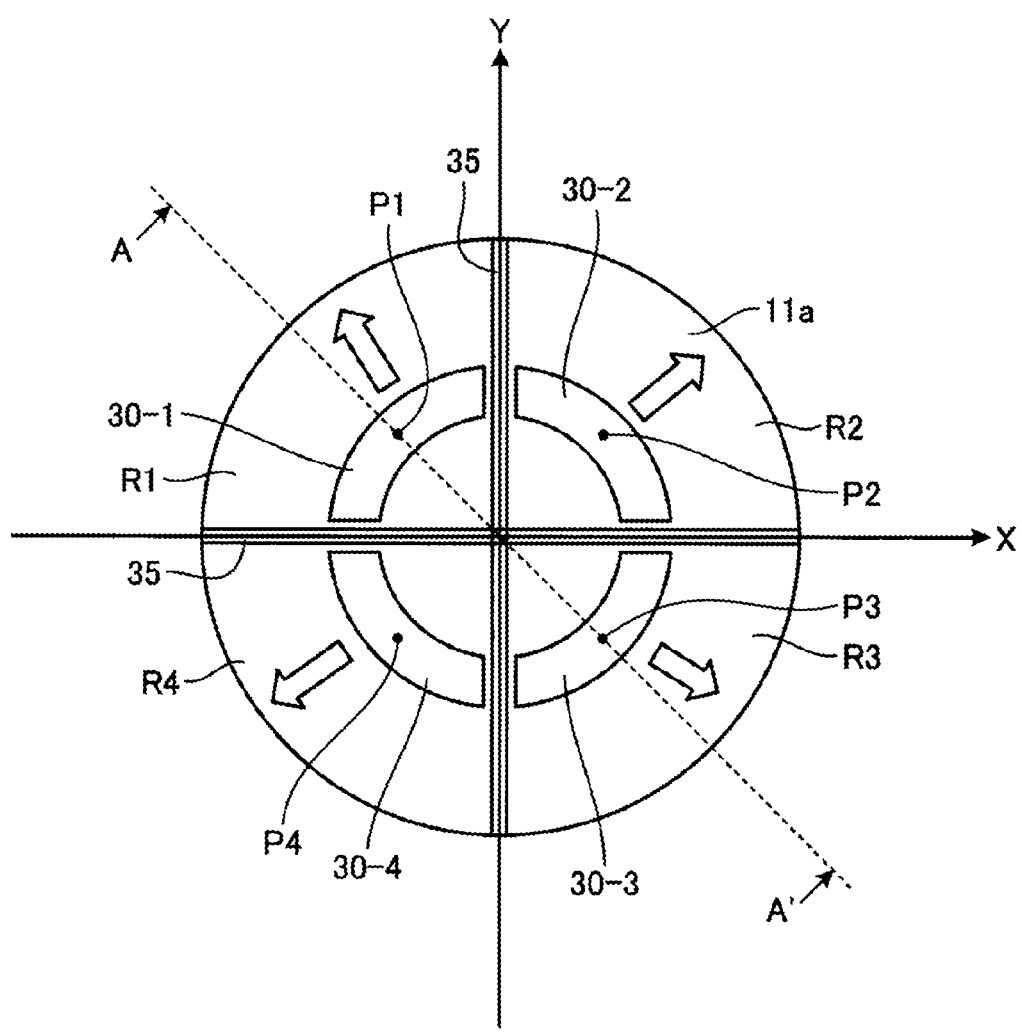
FIG. 2 is a top view schematically depicting the example of the configuration of the plasma processing device according to at least one embodiment.

FIG. 1 is a sectional view schematically depicting an example of the configuration of the plasma processing device according to at least one embodiment, and FIG. 2 is a top view schematically depicting the example of the configuration of the plasma processing device according to at least one embodiment. The following description deals with, as an example, a case where the plasma processing device is a plasma etching device.

A plasma processing device 10 includes a chamber 11, an electrostatic chuck (ESC) 12 which is a substrate stage, an upper electrode 13, an alternating-current power supply 14, a process gas supplying section 15 (a process gas supplier or process gas supply), a coolant supplying section 16 (a coolant supplier or coolant supply), and a control section 19 (a controller). The ESC 12, the upper electrode 13, the alternating-current power supply 14, and the process gas supplying section 15 are an example of a plasma generating section (a plasma generator). The coolant supplying section 16 is an example of a gas supplying section (a gas supplier or gas supply). The ESC 12 includes a high-voltage (HV) electrode (a lower electrode) 21, an insulating film 22, an ESC base 23, an HV power supply 24, and an ESC power supply 25.

The chamber 11 has a cylindrical shape, for example, and houses a substrate 100 such as a wafer to be processed. The ESC 12 holds the substrate 100 inside the chamber 11. While the upper electrode 13 is provided outside the ESC 12, the HV electrode 21 is provided inside the ESC 12. The HV electrode 21 is coated with the insulating film 22 and provided on the ESC base 23. The HV power supply 24 is a variable voltage source for adjusting the potential of the HV electrode 21. The ESC power supply 25 is a variable voltage source for adjusting the potential of the ESC base 23. The substrate 100 is placed on the HV electrode 21 with the insulating film 22 sandwiched therebetween. The ESC 12 makes the substrate 100 electrostatically adhere thereto by the HV electrode 21. The ESC 12 includes an upper surface on which the substrate 100 is placed, a lower surface facing the upper surface, and side surfaces. The ESC 12 can vertically move the substrate 100 by a plurality of unillustrated pins provided on the upper surface of the ESC 12.

The upper electrode 13 is provided above the HV electrode 21. For example, the upper electrode 13 is disposed so as to be parallel to the HV electrode 21. A through hole is provided in the upper electrode 13 so that process gas from the process gas supplying section 15 can be supplied to a space between the upper electrode 13 and the HV electrode 21. For instance, the upper electrode 13 is configured with a plate-like member with a plurality of through holes passing therethrough in a thickness direction. The plasma processing device 10 generates plasma between the upper electrode 13 and the HV electrode 21, supplies the plasma to the side of the substrate 100 where a front surface S1 thereof is located, and processes the substrate 100 by the plasma. Specifically, the front surface S1 of the substrate 100 is etched by dry etching using the plasma.

The alternating-current power supply 14 supplies an alternating current to the upper electrode 13. As a result, plasma is generated between the upper electrode 13 and the HV electrode 21.

The process gas supplying section 15 supplies process gas for generation of plasma to the inside of the chamber 11. The upper electrode 13 and the HV electrode 21 generate plasma from the process gas by using the alternating current from the alternating-current power supply 14.

The coolant supplying section 16 supplies a coolant to the substrate 100 via a plurality of flow channels 12a provided in the ESC 12. The coolant is inert gas such as noble gas and is, for instance, helium (He) gas.

The control section 19 controls operations of the plasma processing device 10. The control section 19 controls, for example, an operation of the chamber 11, an operation of the ESC 12, ON/OFF or the current of the alternating-current power supply 14, ON/OFF or the supply of process gas of the process gas supplying section 15, ON/OFF or the supply of the coolant of the coolant supplying section 16, and so forth.

Moreover, the plasma processing device 10 of the present embodiment includes a plurality of electromagnet sections 30-1 to 30-4 on a top 11a of the chamber 11. A region on the top 11a is divided into a plurality of regions R1 to R4 by a partition member 35, and the electromagnet sections 30-1 to 30-4 are disposed in the regions R1 to R4, respectively. Furthermore, the regions R1 to R4 have the same area. When the chamber 11 has a cylindrical shape, the top 11a has the shape of a disk and the regions R1 to R4 have the same fan shape. For instance, when the region is divided into n (n is an integer greater than or equal to 2) regions, the central angle of each fan-shaped region is 360/n degrees. That is, the top 11a on which the partition member 35 is provided has a configuration which is n-rotation rotationally symmetric with respect to the center. In the case of FIG. 1, n=4 and the top 11a on which the partition member 35 is provided has a 4-rotation rotationally symmetric configuration.

The electromagnet sections 30-1 to 30-4 each include a carriage section 31 (a carriage) having the shape of a circular arc in a plan view, a coil 32 which is disposed on the carriage section 31, and a plasma control unit 33 (i.e., plasma controller 33) which is disposed on the carriage section 31 and controls the strength of a magnetic field which is produced by the coil 32. The carriage section 31 is configured to be movable in the radial direction of the top 11a. For example, the carriage section 31 includes a wheel and a driving mechanism which is provided in the wheel, and is movable by an instruction from the control section 19.

As depicted in FIG. 2, one axis passing through the center of the top 11a is assumed to be an X axis, one axis which passes through the center of the top 11a and is orthogonal to the X axis in the plane of the top 11a is assumed to be a Y axis, and a location on the top 11a is expressed by using the XY coordinates. The locations of predetermined positions (for instance, the center positions) P1 to P4 of the carriage sections 31 on the top 11a are assumed to be the locations of the electromagnet sections 30-1 to 30-4.

As a result of the etching processing, when the etching rate varies in the plane of the substrate, the control section 19 moves the electromagnet sections 30-1 to 30-4 so that the etching rate becomes uniform in the plane of the substrate.

Figure 3A:
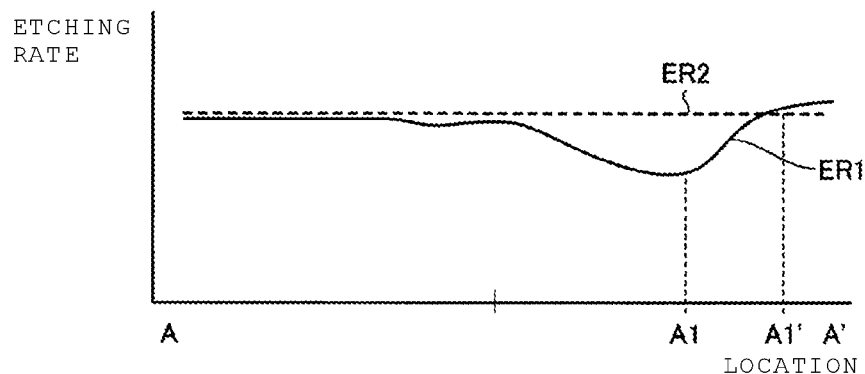
FIGS. 3A and 3B are diagrams showing an example of the relationship between the etching rate of a substrate in a location along the line A-A' of FIG. 2 and the locations of electromagnet sections.
Figure 3B:
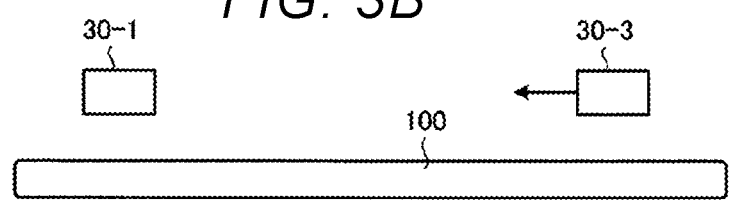
Figure 4A:
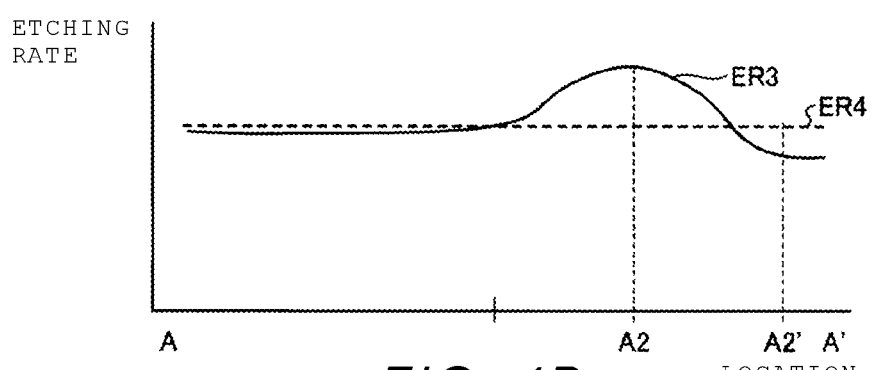
FIGS. 4A and 4B are diagrams showing an example of the relationship between the etching rate of the substrate in a location along the line A-A' of FIG. 2 and the locations of the electromagnet sections.
Figure 4B:
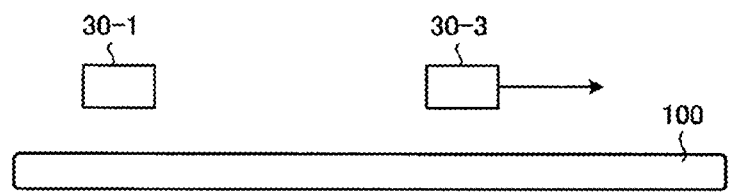

FIGS. 3A and 3B and FIGS. 4A and 4B are diagrams showing an example of the relationship between the etching rate of the substrate in a location along the line A-A' of FIG. 2 and the locations of the electromagnet sections. In these drawings, FIGS. 3A and 4A are diagrams showing the etching rate in a location along the line A-A' and FIGS. 3B and 4B are diagrams showing an example of the placement of the electromagnet sections.

Assume that, when plasma processing (i.e., etching processing) is performed by placing the electromagnet sections 30-1 to 30-4 in the locations shown in FIG. 3B and producing a magnetic field of predetermined strength, an etching rate ER1 shown in FIG. 3A is obtained. The etching rate ER1 is not uniform on the substrate 100 (on the line A-A') and exhibits a drop near a location A1. In general, the plasma density in a low etching rate location is low. Thus, by placing one of the electromagnet sections 30-1 to 30-4 in the low etching rate location, the plasma density in that location is increased, which makes it possible to increase the etching rate. Therefore, in the above case, by moving the electromagnet section 30-3 from a location A1' to the location A1, as indicated by an etching rate ER2, it is possible to make the etching rate of a portion with a low etching rate conform to the etching rate of other portions with a high etching rate.

Assume that, when plasma processing (i.e., etching processing) is performed by placing the electromagnet sections 30-1 to 30-4 in the locations shown in FIG. 4B and producing a magnetic field of predetermined strength, an etching rate ER3 shown in FIG. 4A is obtained. The etching rate ER3 is not uniform on the substrate 100 (on the line A-A') and exhibits a rise in a location A2. In general, the plasma density in a high etching rate location is high. Thus, by displacing one of the electromagnet sections 30-1 to 30-4 from the high etching rate location, the plasma density in that location is reduced, which makes it possible to reduce the etching rate. Therefore, in the above case, by moving the electromagnet section 30-3 from the location A2 to a location A2' on the side of the substrate closer to the periphery thereof, as indicated by an etching rate ER4, it is possible to make the etching rate of a portion with a high etching rate conform to the etching rate of other portions with a low etching rate.

In-plane variations in the etching rate differ depending on, for example, the type of the substrate 100 and an etching condition. The type of the substrate 100 is, for instance, the type, the thickness, or the like, of a film which is disposed on the substrate 100. Therefore, for each of combinations of the type of the substrate 100 and an etching condition, the locations of the electromagnet sections 30-1 to 30-4, with which the in-plane etching rate becomes uniform, are obtained in advance and stored as electromagnet section location information. The electromagnet section location information is information on the type of the substrate 100 and an etching condition correlated with the locations of the electromagnet sections 30-1 to 30-4. The control section 19 controls the locations of the electromagnet sections 30-1 to 30-4 by referring to the electromagnet section location information in accordance with the type of the substrate 100 to be processed and an etching condition. The electromagnet sections 30-1 to 30-4 are usually located so as to be disposed on concentric circles; however, part of the electromagnet sections 30-1 to 30-4 is not disposed on a concentric circle locally in some cases. The electromagnet section location information is stored in a storing section which is provided in the control section 19, for example.

Figure 5:
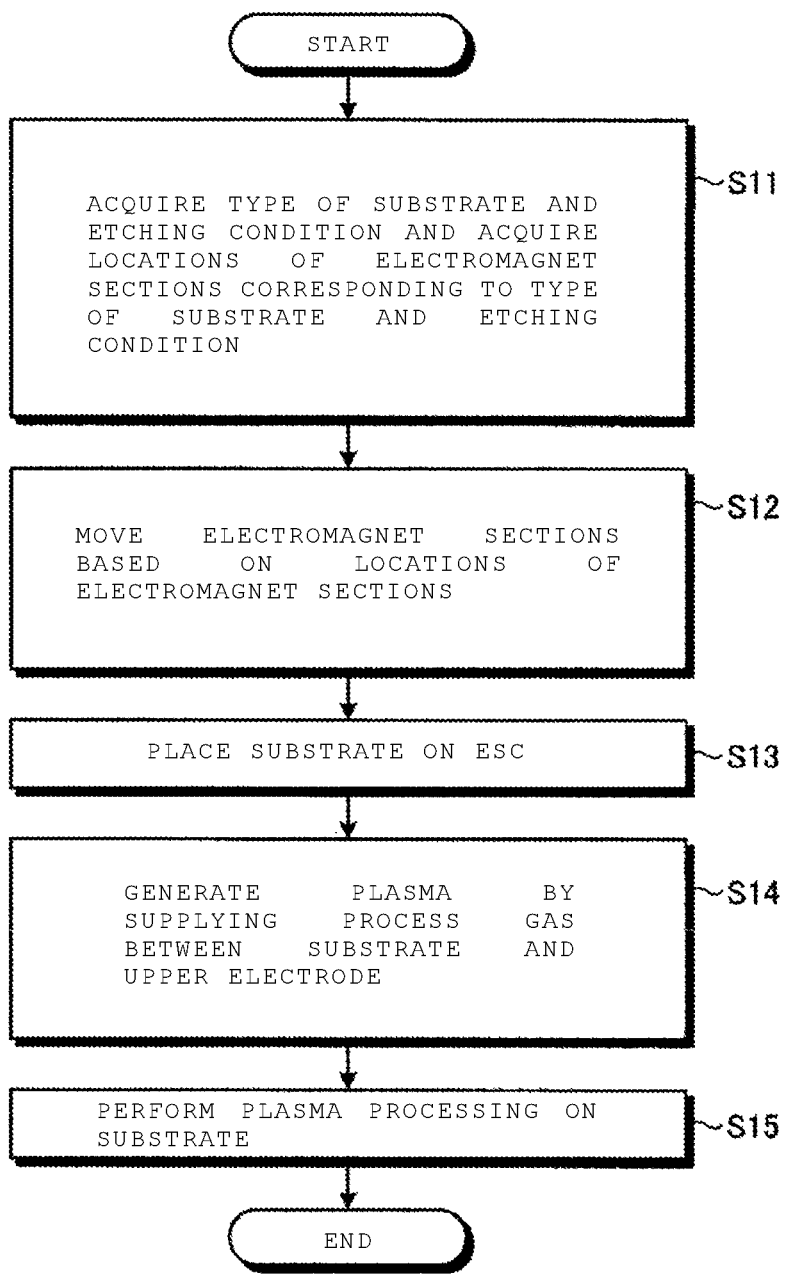
FIG. 5 is a flowchart showing an example of the procedure of a semiconductor device production method according to at least one embodiment.

Next, a method of processing which is performed by the plasma processing device 10 with the above-described configuration will be described. FIG. 5 is a flowchart showing an example of the procedure of the semiconductor device production method according to at least one embodiment. First, the control section 19 acquires the type of the substrate 100 to be processed and an etching condition and acquires, from the electromagnet section location information, the locations of the electromagnet sections 30-1 to 30-4 corresponding to the type of the substrate 100 and the etching condition (Step S11). Next, the control section 19 moves the electromagnet sections 30-1 to 30-4 based on the acquired locations of the electromagnet sections 30-1 to 30-4 (Step S12).

Then, the substrate 100 to be processed is placed on the ESC 12 which is the substrate stage (Step S13). Next, process gas is supplied between the substrate 100 and the upper electrode 13 from the process gas supplying section 15, an alternating current is supplied to the upper electrode 13 from the alternating-current power supply 14, a magnetic field of predetermined strength is produced by passing the current through the electromagnet sections 30-1 to 30-4, and plasma is generated between the upper electrode 13 and the HV electrode 21 (Step S14). Then, the plasma processing, in this example, plasma etching processing is performed on the substrate 100 (Step S15). In this way, the substrate 100 is subjected to the plasma processing and a semiconductor device is produced. This is the end of the processing.

The above description deals with a case where the electromagnet sections 30-1 to 30-4 are disposed in the fan-shaped regions R1 to R4 whose central angle is 90 degrees; however, one or more embodiments are not limited thereto. A region on the top 11a may be divided into n fan-shaped regions R1 to Rn (n is an integer greater than or equal to 2) whose central angle is 360/n degrees and the electromagnet sections may be disposed in the regions R1 to Rn. The larger the number n into which a region on the top 11a is divided, the more locally the strength of a magnetic field can be controlled. Moreover, in the above description, the number of electromagnet sections which are disposed in each of the regions R1 to R4 is one; alternatively, a plurality of electromagnet sections may be disposed in each of the regions R1 to R4.

Figure 6:
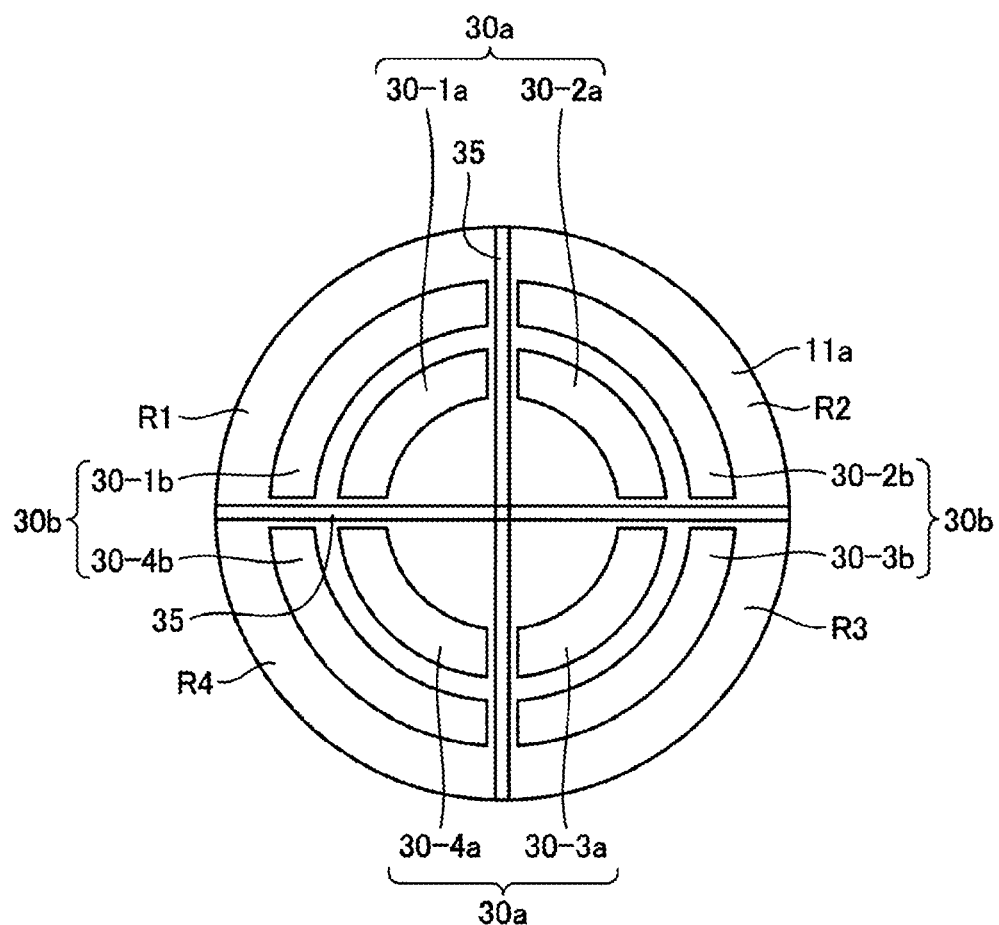
FIG. 6 is a top view depicting another example of the configuration of the plasma processing device according to at least one embodiment.

FIG. 6 is a top view depicting another example of the configuration of the plasma processing device according to at least one embodiment. As depicted in this drawing, on the top 11a, two annular electromagnets are concentrically disposed. Each annular electromagnet is divided into a plurality of portions; in an example of FIG. 6, each annular electromagnet is divided into four portions. In the fan-shaped region R1 whose central angle is 90 degrees, an electromagnet section 30-1a is disposed in an area closer to the inside and an electromagnet section 30-1b is disposed in an area closer to the outside. Moreover, in the region R2, an electromagnet section 30-2a is disposed in an area closer to the inside and an electromagnet section 30-2b is disposed in an area closer to the outside, in the region R3, an electromagnet section 30-3a is disposed in an area closer to the inside and an electromagnet section 30-3b is disposed in an area closer to the outside, and, in the region R4, an electromagnet section 30-4a is disposed in an area closer to the inside and an electromagnet section 30-4b is disposed in an area closer to the outside. The electromagnet sections 30-1a to 30-4a, each being disposed in an area closer to the inside, form one annular electromagnet 30a, and the electromagnet sections 30-1b to 30-4b, each being disposed in an area closer to the outside, form one annular electromagnet 30b. Each of the electromagnet sections 30-1a to 30-4a and 30-1b to 30-4b is configured so as to be movable in the radial direction of the top 11a which is circular. It is to be noted that three or more electromagnets may be concentrically disposed. By placing a plurality of electromagnet sections in one region in this manner, it is possible to control a magnetic field more precisely.

Moreover, the above description deals with a plasma processing device of the capacitive coupled plasma type as an example; instead, the above-described embodiment may be applied to a plasma processing device of the inductive coupled plasma (ICP) type. Furthermore, a plasma etching device is taken as an example of the plasma processing device 10; alternatively, the above-described embodiment may be applied to film formation processing using plasma, for example, a plasma chemical vapor deposition (CVD) device or the like.

In at least one embodiment, a region on the top 11a of the chamber 11 of the plasma processing device 10 is divided into the plurality of fan-shaped regions R1 to R4 having the same area and, in the regions R1 to R4, the electromagnet sections 30-1 to 30-4, each being movable in the radial direction of the top 11a, are respectively disposed. Then, the electromagnet sections 30-1 to 30-4 are moved so that the plasma density on the substrate 100 becomes uniform at the time of plasma processing. As a result, even when a portion in which the plasma density is not uniform is present on the substrate 100, by moving the electromagnet sections 30-1 to 30-4, it is possible to adjust the magnetic field so that the plasma density becomes uniform on the substrate 100 as a whole and thereby maintain the symmetry (uniformity) of plasma density with ease. This produces the effect of making uniform the results of plasma processing, for example, etching processing or film formation processing, which is performed on the substrate 100.

Moreover, in the regions R1 to R4 on the top 11a, members other than the electromagnet sections 30-1 to 30-4 are not provided. This allows the electromagnet sections 30-1 to 30-4 to move without being interfered with, which makes it possible to move the electromagnet sections 30-1 to 30-4 easily.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A plasma processing device comprising:
    a chamber;
    a substrate stage configured to support a substrate inside the chamber;
    a plasma generator configured to generate plasma to process the substrate in a space above the substrate inside the chamber;
    a plurality of electromagnet sections provided on a top of the chamber, at least one of the plurality of electromagnetic sections including a coil; and
    a controller configured to move the at least one of the plurality of the electromagnet sections to produce the plasma on the substrate such that the plasma has a uniform plasma density, to move the at least one of the plurality of the electromagnet sections on an upper part of the substrate, so as to be independently movable from the substrate, and to control a strength of a magnetic field produced by the coil;
    wherein the at least one of the plurality of the electromagnet sections further includes a carriage on which the coil and the controller are placed, the carriage configured to move the at least one of the plurality of the electromagnet sections.

2. The plasma processing device according to claim 1, wherein the controller is configured to acquire etching rate information of the substrate and determine a location for the at least one of the plurality of the electromagnet sections.

3. The plasma processing device according to claim 2, wherein the controller is configured to control the strength of the magnetic field and the location of the at least one of the plurality of the electromagnet sections to produce the uniform plasma density on the substrate.

4. The plasma processing device according to claim 1, wherein the top of the chamber includes two or more regions configured to receive two or more corresponding the at least one of the plurality of the electromagnet sections.

5. The plasma processing device according to claim 4, wherein the two or more corresponding the plurality of the electromagnet sections are shaped as equally divided arcs of a concentric circle movable in a radial direction.

6. The plasma processing device according to claim 4, wherein each of the two or more regions includes two or more of the plurality of the electromagnet sections shaped as arcs of a concentric circle and movable in a radial direction.

7. A method for generating plasma of a uniform density to produce one or more semiconductor devices, the method comprising:
supporting a substrate on a substrate stage inside a chamber;
acquiring type information and initial etching rate information of the substrate;
determining, in response to the acquired etching rate information, at least one location to place at least one of a plurality of electromagnet sections over the substrate;
moving the at least one of the plurality of the electromagnet sections to the at least one determined location;
controlling a power output of the at least one of the plurality of the electromagnet sections;
generating plasma to process the substrate in a space above the substrate inside the chamber; and
performing plasma processing on the substrate.

8. The method of claim 7, further comprising determining, in response to the acquired type information and etching rate information, the power output of the at least one of the plurality of the electromagnet sections for producing the plasma having the uniform density.

9. The method of claim 8, further comprising powering on the at least one of the plurality of the electromagnet sections according to the determined power output when the at least one of the plurality of the electromagnet sections has been placed at the at least one determined location before generating the plasma to process the substrate.

10. The method of claim 7, further comprising providing the at least one of the plurality of the electromagnet sections on a top surface of the chamber, the at least one of the plurality of the electromagnet sections including a carriage configured to move the at least one of the plurality of the electromagnet sections in a radial direction relative to the substrate stage.

11. The method of claim 10, further comprising providing two or more of the plurality of the electromagnet sections forming a concentric circle on the top surface of the chamber movable in the radial direction.

12. A system for generating a uniform plasma density, the system comprising:
a chamber configured to perform plasma processing on a substrate;
at least one of a plurality of electromagnet sections positioned on top of and movable relative to the chamber, the at least one of the plurality of electromagnet sections including a coil; and
a controller configured to:
acquire a type information and an etching rate information of the substrate;
determine a power output of the at least one of the plurality of electromagnet sections and a position at which to place the at least one of the plurality of electromagnet sections;
control a strength of a magnetic field produced by the coil; and
move the at least one of the plurality of the electromagnet sections to the position and operate the at least one of the plurality of the electromagnet sections at the power output during plasma processing of the substrate
wherein the at least one of the plurality of electromagnet sections further includes a carriage on which the coil and the controller are placed, the carriage configured to move the at least one of the plurality of electromagnet sections.

13. The system of claim 12, wherein the chamber comprises:
a substrate stage configured to support the substrate inside the chamber; and
a plasma generator configured to generate plasma to process the substrate in a space above the substrate inside the chamber.

14. The system of claim 12, wherein a top of the chamber includes two or more regions configured to receive two or more corresponding plurality of the electromagnet sections.

15. The system of claim 14, wherein the two or more corresponding plurality of the electromagnet sections are equally divided arcs of a concentric circle movable in a radial direction.

16. The system of claim 14, wherein each of the two or more regions includes two or more of the plurality of the electromagnet sections shaped as arcs of a concentric circle and movable in a radial direction.

* * * * *